United States Patent [19]

Brown et al.

[11] 4,369,501

[45] Jan. 18, 1983

[54] DUAL CYCLE DATA DETECTION SYSTEM AND METHOD FOR BUBBLE MEMORIES

[75] Inventors: Caroll J. Brown, San Jose; Lionel D. Provazek, Campbell, both of Calif.

[73] Assignee: International Business Machines Corporation, Armonk, N.Y.

[21] Appl. No.: 277,471

[22] Filed: Jun. 25, 1981

[51] Int. Cl.³ .............................................. G11C 19/08
[52] U.S. Cl. ........................................................ 365/8
[58] Field of Search ................ 365/7, 9, 158; 329/200

[56] References Cited

U.S. PATENT DOCUMENTS

| | | | |
|---|---|---|---|
| 3,813,660 | 5/1974 | Buhrer | 365/8 |
| 3,953,840 | 4/1976 | Cutler et al. | 365/8 |
| 4,177,521 | 12/1979 | Schaefer | 365/8 |
| 4,308,593 | 12/1981 | Young et al. | 365/7 |

*Primary Examiner*—James W. Moffitt
*Attorney, Agent, or Firm*—Richard E. Cummins

[57] ABSTRACT

A data detection system and method for a bubble memory is disclosed in which the memory is operated in a start-stop mode during reading of data stored in two separate major loops which are stepped concurrently and wherein each major loop comprises interleaved data and no-data cells. The field rotation is controlled so that if the read operation is stopped, a no-bubble cell of each major loop is stopped adjacent the magneto-resistive sensor which provides read data signals to the detector of that major loop. The detector involves a detection cycle comprising a reference portion and a data portion. The signal generated during the data portion is integrated and compared against the integrated value of the signal generated during the previous reference portion. The comparison of two integrated values, one from a data cell and one from a reference cell, produces different results depending on whether a bubble or no-bubble was stored in the data cell. In each detector, the result of the comparison is buffered in a latch which permits the data from the system to be clocked out of the latches at a frequency corresponding to the stepping frequency of the major loops.

10 Claims, 3 Drawing Figures

DUAL CYCLE DATA DETECTION SYSTEM AND METHOD FOR BUBBLE MEMORIES

DESCRIPTION

1. Field of Invention

This invention relates in general to systems and methods for reading data stored in magnetic bubble memories and, in particular, to a detection system and method for use in a bubble memory system of the major/minor loop configuration.

2. Description of Prior Art

The prior art has disclosed various arrangements for storing data in a magnetic bubble memory. In one prior art arrangement, the memory is configured as a plurality of minor loops with a major loop as an input and another major loop as an output. Data bits are entered into the memory serial by bit until the major loop contains a number of bits which are then transferred in parallel to the minor loops. Data is read from memory by transferring data parallel by bit from the minor loop array to a major loop and then stepping the major loop past a bubble sensor to provide the serial by bit data.

The prior art also suggests a major/minor loop configuration in which the minor loops are arranged in two separate arrays, with each array provided with its own major loops. Serial by bit data entered into the memory is, in effect, stored alternately in one array and then the other. Likewise, serial by bit data is read out from each array on subsequent cycles and interleaved to provide the output data. U.S. Pat. No. 4,075,611 is an example of such a system.

While the advantages of such an arrangement are well established in the art, there is still problems in reliably distinguishing between signals from the bubble sensor, representing a no-bubble situation, and signals representing the presence of a bubble in a bit cell. As is well known, during one cycle of the drive field, a bubble produces two pulses from the sensor while the absence of a bubble produces no pulses or much smaller pulses. Because the size and shape of signals produced by the bubble sensors vary considerably, some of the more conventional signal detection methods which rely on detecting the amplitude of the signal relative to some preestablished reference are not very reliable. The amplitude of the signal from the sensor is known to vary by a ratio of 5 to 1 in some arrays. In addition, the signal shape can vary from one array to the next as a result of process variations in the manufacture of the chips and the position of the minor loop array relative to the various magnetic fields which are required to maintain and step the loops. In addition, there is generally a relatively high noise component in the output signal which further complicates the detection process.

The present invention provides an improved detection system and method which overcomes the reliability problem encountered by many of the prior art systems by establishing a new reference signal for use in detecting the significance of each bit position as each bit position is read.

SUMMARY OF THE INVENTION

The improved detection apparatus of the present invention is based on the comparison of the integrated values of two signals which are generated by the MR sensors on successive cycles of the drive field which step the major and minor loops on the chip. The first signal is a reference signal and is generated during the reference cycle during which a no-bubble cell of the magnetic loop is always moved past the MR sensor. The sensed signal is amplified and integrated and its value held, while the signal in the following data cell is amplified and integrated. The two values are then compared in a suitable voltage comparator and when the difference exceeds a predetermined value, a determination is made that the cell contains a bubble and a 1 data bit value is assigned. If the comparison results in the value of the two signals being substantially equal, a determination is made that the data cell did not contain a bubble and a 0 bit value is assigned to that cell.

Each major/minor loop array on the chip is provided with its own detector system so that the output of the detectors are interleaved to provide an output data rate which matches the field rotation frequency. The use of a dynamic reference level for each data bit position of the major loop results in a highly reliable data detector.

It is, therefore, an object of the present invention to provide an improved method and system for detecting data read from a bubble memory system.

A further object of the present invention is to provide a detection scheme for a bubble memory in which a dynamic reference level signal is established for each data bit position of the major loop that is read out.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
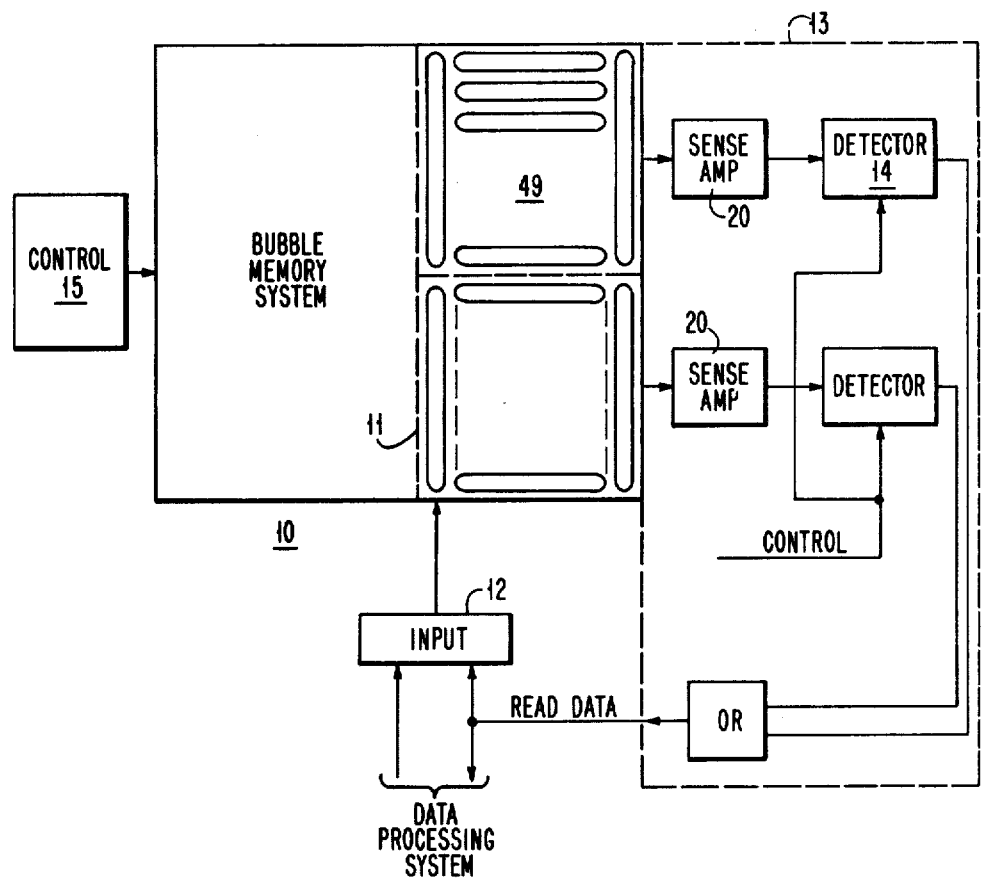
FIG. 1 illustrates in block diagram form a bubble memory system embodying the present invention.

The bubble memory system shown in FIG. 1 comprises generally a memory module 10 which includes a plurality of bubble chips 11, an input adapter 12 for entering data into one of the modules, an output adapter 13 which includes the detection system 14 to provide output data, and a suitable control block 15 which provides the necessary control signals to the memory module 10 to achieve the various input/output and storage functions.

Data stored in memory module 10 is supplied from a data processing system to the input adapter 12. Data read from memory 10 is reentered into the memory through the input adapter as in conventional bubble memory systems or supplied to the using system. The details of the detection system 14, shown in FIG. 1, are illustrated in FIG. 2.

Figure 2:
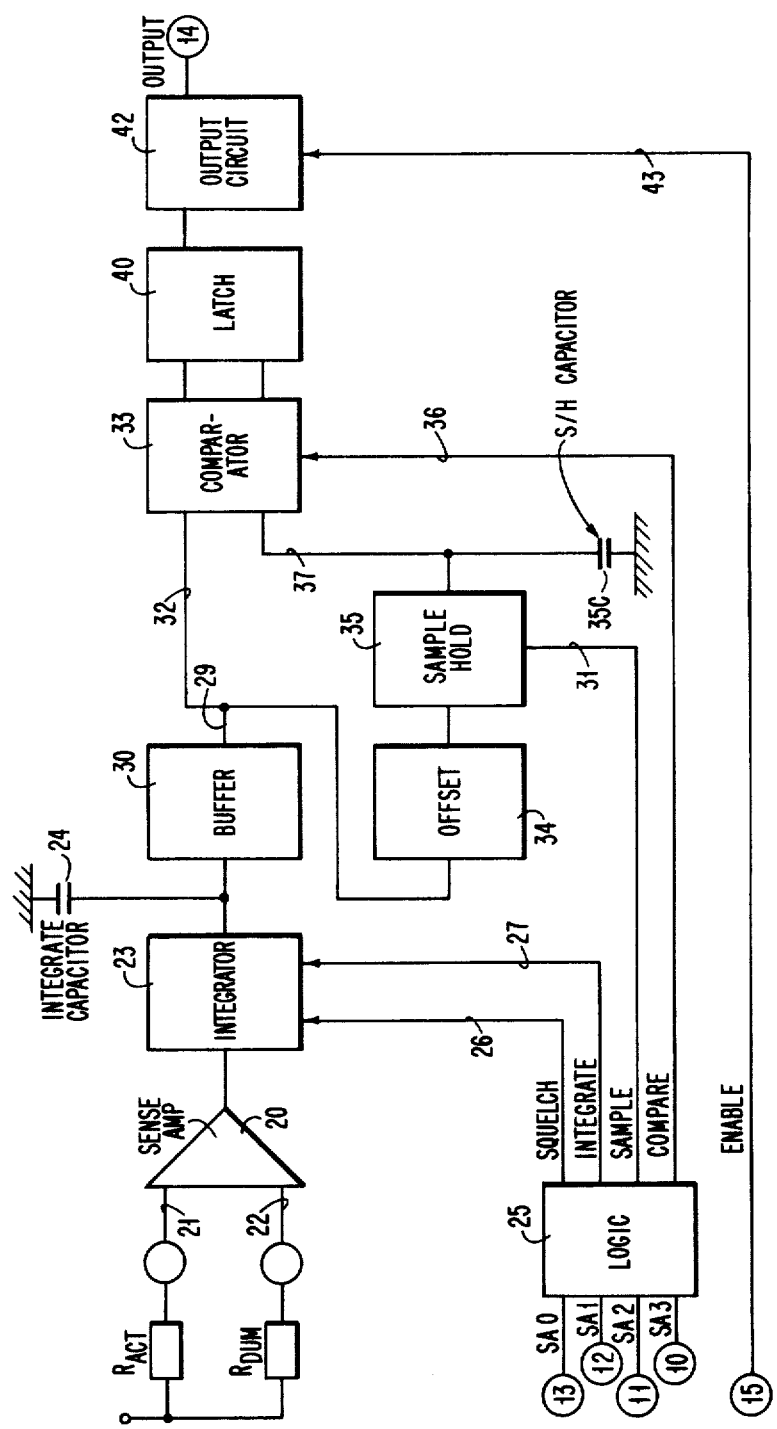
FIG. 2 illustrates the details of the detector shown in FIG. 1 in block form.

With reference to FIG. 2, the detecting system includes the sense amplifier 20 having a pair of differential input terminals 21 and 22 which are supplied with signals from a pair of conventional magnetoresistive sensors generally employed for detecting the presence or absence of bubbles in major loops of bubble memory systems. The output of the sense amplifier is connected to an integrator 23 including the integrating capacitor 24. The integrator is supplied with a pair of control signals from the logic block 25. The first control signal on line 26 is a "squelch" signal which resets the integrator to an initial value. The second control signal from block 25 is the integrate signal on line 27 which sets a window for integrating the value of the input signal for a particular time during each detection cycle.

Figure 3:
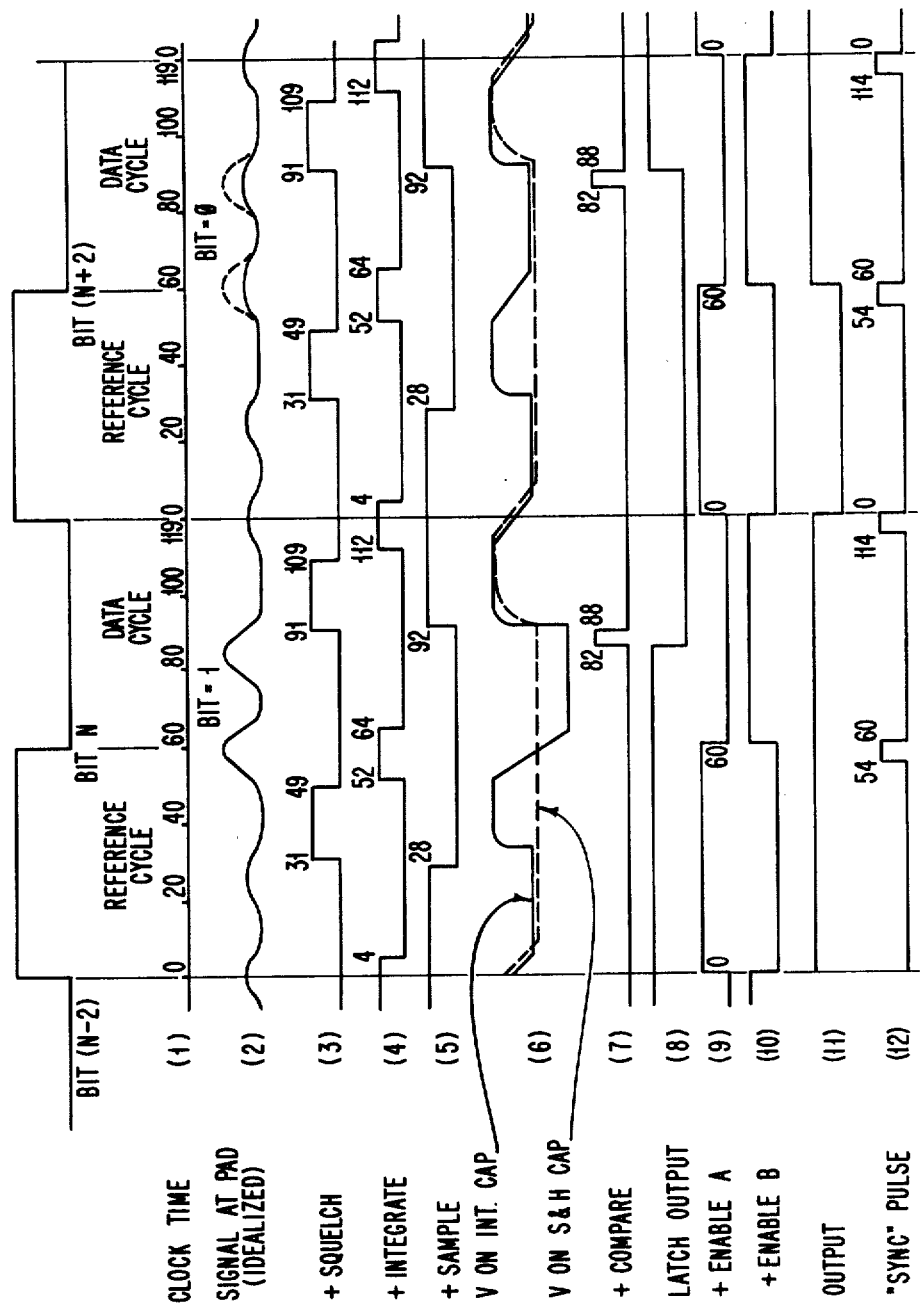
FIG. 3 is a timing diagram illustrating various signals which appear in the detector shown in FIG. 2.

As shown in FIG. 3, a detection cycle involves a reference cycle and a data cycle.

The integrator 23 is connected to a buffer 30 which functions to isolate the value of the voltage on integrating capacitor 24 from the rest of the circuits. The output 29 of the buffer is supplied to one input 32 of comparator 33 and to an offset circuit 34 which is connected to the sample and hole circuit 35. The function of the offset circuit 34 will be explained in detail when describing the overall operation of the detection system. Its basic function, however, is merely to adjust the voltage levels to assist the comparator 33 in the comparing function. The sample and hold circuit 35 has its output connected to input terminal 37 of comparator 33. A sample signal on line 31 from logic 25 transfers the voltage on capacitor 24 to the sample and hold capacitor 35. The comparator 33 is also provided with a control signal labelled "Compare" on line 36. The output of the comparator is connected to a latch 40 which is set to one of two values, depending on the output signal from the comparator. The positive output of the latch is gated through the output gate 42 in response to an enable signal from external control logic 15 (FIG. 1). The operation of the system shown in FIG. 2 will now be explained in connection with the timing diagram shown in FIG. 3.

The detector shown in FIG. 2 is associated with one minor loop array 49 of the bubble module 11, as shown in FIG. 1. A similar detection scheme is employed in connection with the other minor loop array. The data cycles of the two detectors are coincident in time. Both detectors are either in the reference cycle or the data cycle. Line 1 of FIG. 3 shows that each bit detection cycle involves 120 clock pulses. The reference cycle extends from clock time 0 to clock time 59, while the data cycle extends from clock time 60 to clock time 119. The output of the two detectors are interleaved by control of the enable signal on line 43 in FIG. 2 to provide an output data rate corresponding to the frequency at which the loops are stepped.

Line 2 of FIG. 3 represents the output of the sense amplifier 20 during two sequential detection cycles for bit n and n+2. As shown, bit n is a binary 1 and bit n+2 is a binary 0. Line 3 illustrates the "squelch" signal from logic 25 applied on line 26 to integrator 23. The squelch signal is active from clock time 31 through 49 and 91 through 109. As mentioned previously, the function of the squelch signal is to reset the integrator 23 to a preestablished beginning value.

Line 4 of FIG. 3 represents the integrate control signal applied to integrator 23 from logic 25. The integrate signal is activate from clock time 52 to clock time 64 and from clock time 112 to clock time 4 of the following detection cycle. The function of the integrate pulse is to gate the integrator 23 on during a time corresponding to the first pulse of the signal from the sense amplifier 20. The signal from the sense amplifier 20 is converted from a voltage to a current during the integrate pulse of the reference cycle. The current flows into the integrator capacitor 24, producing a negative going voltage change proportional to the integral of the current.

The sample command is shown on line 5 of FIG. 3 and is supplied to the sample and hold block 35 of FIG. 2 from logic 25 on line 31. The sample command is active from clock time 92 of one detecting cycle to clock time 28 of the following detection cycle. The voltage on the sample and hold capacitor 35c is shown in dash form on line 6, while the voltage on the integrator capacitor 24 is shown in solid form on line 6 of FIG. 3.

The two voltage signals shown on line 6 of FIG. 3 are compared in comparator 33 in response to the compare control pulse shown on line 7 of FIG. 3. The compare pulse, as shown, extends from clock time 82 to clock time 88 and sets the latch 40 to the appropriate value corresponding to the output of the comparator. The output of the latch shown on line 8 of FIG. 3 is transferred through the output logic circuit 42 of FIG. 2 by enable A signal shown on line 9 of FIG. 3. The sync pulses shown on line 12 of FIG. 3 from clock time 54 through 60 and 114 through 0 of each cycle provide data from each array where the first sync pulse from 56 through 60 senses the first array for bit n and n+2, while the second sync pulse extending from clock time 114 to 0 senses the second array for bit n+1, etc.

The details of the various circuits shown in block form in FIG. 2 have not been illustrated or described since they form no part of the present invention and may employ known circuits. In that regard, it is desirable for the integrator to be of the type employing a current mirror which maintains low power dissipation by keeping the idle current low. The relatively high current for integration goes on only when the idle current is switched to the current mirror. The use of a current mirror in the integrator also maximizes the voltage swing possible on the integrator capacitor 24 since the voltage can swing closer to the negative power supply. This, in turn, gives maximum voltage sensitivity and minimizes the effect of error voltages.

Also, the acquisition time of the sample and hold circuit is critical. The acquisition time is the time it takes the voltage on the sample and hold capacitor 35c to match the input voltage supplied to the sample and hold circuit. To minimize the acquisition time, the sample command is turned on at the beginning of the squelch pulse and is left on almost until the next squelch pulse. The sample and hold capacitor is charged to the up level produced on the integrate capacitor by the squelch pulse. This insures that the sample and hold capacitor will then always charge negatively to acquire the final integrator voltage. This gives the fastest acquisition time since the circuit employed has the innate ability to charge the sample and hold capacitor faster in a negative going direction than in a positive going direction. By being on during the integrate pulse, the sample and hold capacitor can follow the integration voltage and be close to the correct value when the integration ends. Additional time after integrate allows the sample and hold circuit to completely reach the final value.

The offset circuit 34 functions to provide a slightly lower voltage level to the sample and hold circuit and capacitor than to the comparator circuit. By off-setting the sample and hold input slightly lower, the comparator detects a no-bubble signal in the data cycle as a 0. Conversely, when a bubble signal occurs in the data cycle, the integrator output to the comparator will be lower than the sample and hold level and a 1 will be detected.

It should be understood that in the memory shown in FIG. 1 no-bubbles are automatically inserted into the output data stream since the output channel contains the appropriate configuration on the bubble chip so that this is achieved. The detection arrangement then permits start-stop read operation of the memory with bubbles adjacent to the sensor, provided the memory is stopped with a no-bubble cell on the magnetoresistive sensor. Problems which are inherent in start-stop operation of magnetic bubble memories where no provision is made for stopping with a no-bubble cell on the MR sensor are, therefore, avoided.

In prior art start-stop bubble memories where a data cell is the first cell to be read, several problems are known to exist. One problem involves the fact that the first cell after the stopping operation suffers from phase and size distortion. This occurs when the drive field is starting up from its initially low value obtained during the stop operation to its normal run value, which is substantially higher. The distortion occurs because during the stop cycle, the bubble is sitting in the bottom of a stationary energy well. When the energy well starts moving, the bubble shifts up to a point on the side of the wall. Thus, the phase of the bubble is shifting during the first rotating field cycle after having been stopped. The present system overcomes this problem by always stopping with the no-bubble cell on the MR sensor. Thus, the first cycle is always a no-bubble cycle, and the bubble phase shift problem is avoided. The second cycle is the data bit, but by then the bubble phase has reached its normal operating value. Further, with the present arrangement of the system stopping with a no data cell on the MR sensor, the reference cycle occurs immediately preceding the data cycle. This avoids the problem of trying to store the reference voltage when the system is stopped.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new and desire to secure by Letters Patent is:

1. In a method of reading data from a bubble memory system having a major loop comprising a plurality of data cells successive ones of which are spaced apart by non-data cells and which store binary data bits in the form of a magnetic bubble or no-bubble in each of said data cells and in which the major loop is stepped relative to a sensing device to provide read signals indicative of the presence or absence of a magnetic bubble in each said data cell position of said loop, the improvement comprising:
   (a) integrating the signal provided by said device for a first period of time during movement of a non-data cell past said device;
   (b) integrating the signal provided by said device for a second period of time during movement of the succeeding data cell past said device;
   (c) comparing the values of said signals integrated during said first and second periods of time to determine if they are substantially equal or substantially unequal; and
   (d) repeating steps (a) through (c) for each pair of cells in said major loop which are moved past said sensing device whereby the binary data stored in said major loop is detected in accordance with the results of said comparing operation.

2. The method recited in claim 1 in which said bubble memory system has a pair of said major loops in which said data cells in each said loop are coincident relative to the respective sensing devices so as to provide one bit of binary data from one of said loops for each step of said major loops.

3. The method recited in claim 2 in which said major loops are stepped by the same field stepping means and further comprising generating a sampling signal at a frequency corresponding to the frequency at which said major loops are stepped to sample the output of said comparison steps associated with each said major loop to provide data signals at a rate corresponding to said stepped frequency.

4. A method of detecting data signals provided by the output of a sense amplifier during movement of a bubble of a major loop past a pair of MR sensors of a minor/major loop configured bubble memory having first and second memory loop arrays each provided with its own sense amplifier and signal detector and where a pair of bubble memory loop cells are required to store one bit of binary data, said method comprising the steps of:
   moving two cell positions of said major loop past said sensors to generate a no-bubble signal during a first reference cycle and a data signal during a second data cycle;
   integrating said first signal during said first cycle to provide a reference voltage;
   integrating said second signal during said second cycle to provide a second voltage corresponding to data stored in said cell;
   comparing said reference voltage and said second voltage to establish a binary value for the data represented by said data signal.

5. The method recited in claim 4 in which said first two cell positions of said major loop are moved from a stopped position.

6. The method recited in claim 5 in which the reference cycle in one array is coincident with the reference cycle in the other array.

7. A data detector for a bubble memory system which includes a major loop having data bits stored in data cells in the form of magnetic bubbles and no magnetic bubbles where each data cell is preceded by a no-bubble cell and means are provided for stepping said major loop past a sensing transducer to provide first and second signals corresponding respectively to said no-bubble cell and said data cell, said detector comprising:
   (a) an integrator having an input terminal for receiving said first and second signals from said sensing transducer;
   (b) a sample and hold circuit coupled to receive the output of said integrator;
   (c) a comparator having one input connected to said sample and hold circuit and a second input selectively connected to the output of said integrator;
   (d) a latch having an input connected to the output of said comparator; and
   (e) control circuits for providing control signals to said integrator, to said sample and hold circuit, to said comparator, and to said latch to cause the output of said latch to be set to a value corresponding to the one bit of read data stored in the cell which was stepped past said sensing transducer.

8. The detector recited in claim 7 in which an offset circuit couples the integrator output to the input of the sample and hold circuit.

9. The detector recited in claim 8 in which said integrator is of the current mirror type.

10. The detector recited in claim 9 in which said sample and hold circuit includes a capacitor which is charged negatively at a relatively fast rate.

* * * * *